(12) United States Patent
Hojabri et al.

(10) Patent No.: US 11,789,070 B2
(45) Date of Patent: *Oct. 17, 2023

(54) INTEGRATED COMMUNICATION LINK TESTING

(71) Applicant: Tektronix, Inc., Beaverton, OR (US)

(72) Inventors: Pirooz Hojabri, San Jose, CA (US); Joshua J. O'Brien, Aloha, OR (US); Gregory A. Martin, Lake Oswego, OR (US); Patrick Satarzadeh, San Jose, CA (US); Karen Hovakimyan, San Jose, CA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/324,007

(22) Filed: May 18, 2021

(65) Prior Publication Data
US 2021/0270893 A1 Sep. 2, 2021

Related U.S. Application Data

(63) Continuation of application No. 16/440,944, filed on Jun. 13, 2019, now Pat. No. 11,009,546.
(Continued)

(51) Int. Cl.
*G06F 11/00* (2006.01)
*G01R 31/317* (2006.01)
(Continued)

(52) U.S. Cl.
CPC ..... *G01R 31/3171* (2013.01); *G01R 31/2841* (2013.01); *G01R 31/3187* (2013.01); *G01R 31/31905* (2013.01)

(58) Field of Classification Search
CPC ............ G01R 31/3171; G01R 31/2841; G01R 31/3187; G01R 31/31905
See application file for complete search history.

(56) References Cited

U.S. PATENT DOCUMENTS 5,289,116 A * 2/1994 Kurita ................ G01R 31/3167
324/73.1
6,169,763 B1 1/2001 Woodward et al.
(Continued)

FOREIGN PATENT DOCUMENTS

JP 2001527712 12/2001
JP 2005127765 5/2005

*Primary Examiner* — Samir W Rizk
(74) *Attorney, Agent, or Firm* — Miller Nash LLP; Andrew J. Harrington

(57) ABSTRACT

A test and measurement device includes an input configured to receive an analog signal from a Device Under Test (DUT), an Analog to Digital Converter (ADC) coupled to the input and structured to convert the analog signal to a digital signal, a receiver implemented in a first Field Programmable Gate Array (FPGA) and structured to accept the digital signal and perform signal analysis on the digital signal, a transmitter implemented in a second FPGA and structured to generate a digital output signal, and a Digital to Analog Converter (DAC) coupled to the transmitter and structured to convert the digital output signal from the transmitter to an analog signal, and structured to send the analog signal to the DUT. The receiver and the transmitter are coupled together by a high speed data link over which data about the current testing environment may be shared.

19 Claims, 5 Drawing Sheets

Related U.S. Application Data

(60) Provisional application No. 62/684,784, filed on Jun. 14, 2018.

(51) Int. Cl.
*G01R 31/28* (2006.01)
*G01R 31/3187* (2006.01)
*G01R 31/319* (2006.01)

(56) References Cited

U.S. PATENT DOCUMENTS 9,100,030 B1 * 8/2015 Haisch .................... G06F 1/022
2005/0110513 A1   5/2005 Osada et al.

* cited by examiner

INTEGRATED COMMUNICATION LINK TESTING

CROSS-REFERENCE TO RELATED APPLICATIONS

This application is a continuation of, and claims benefit to, U.S. patent application Ser. No. 16/440,944 filed Jun. 13, 2019, entitled INTEGRATED SOLUTION FOR COMMUNICATION LINK TESTING, now U.S. Pat. No. 11,009,546 issued May 18, 2021, the contents of which are incorporated by reference herein.

FIELD OF THE INVENTION

This disclosure is directed to test and measurement devices, and, more particularly, to systems and methods for testing communication links or devices using a high-precision signal output generator that may also work in close cooperation with a high-precision signal receiver.

BACKGROUND

Precision testing of modern electronic devices currently requires a collection of expensive equipment that was not necessarily designed to operate cooperatively. Modern day equipment requirements for performing precision or high-frequency signal analysis on communication links or devices typically include a Bit Error Rate Tester (BERT), an Arbitrary Waveform Generator (AWG), potentially a Programmable Pattern Generator (PPG), an Oscilloscope, a computer to integrate the functionality of the devices, software operating on the computer, and multiple cables that connect all of the devices to one another and to the Device Under Test (DUT). Using such a collection of disparate instruments and equipment to perform tests suffers from many problems, in addition to the obvious problem of the expense of purchasing, managing, and maintaining multiple test pieces in a test assembly.

One of the problems with using such a collection of instruments is related to the non-repeatability of measurements. With precision testing, oftentimes small differences within the system create large differences in particular measurement. For example, using different length cables may have an effect on the output impedance of the AWG or in the propagation time of a signal being received by the oscilloscope. Thus, even when the same major components are used in two different test assemblies, measurements may differ from one assembly to the other based on the length of the connection cables. Oftentimes, even the major components are not the same across various test assemblies, as precision testing equipment is very expensive. For example, one testing assembly may be using a second version of an AWG while another test assembly is using a first version, which may have a limited set of features. In such a scenario, the second test assembly may be prevented from running the same tests as the first assembly due to the limited functionality of only the AWG component. Further, some of the differences affecting the measurements may not even be outwardly detectable. For instance, the impedance of the connection cables may change over time, or a cable end may be experiencing wear that is internal to the cable and thus invisible to the user. In addition, high-precision instruments are generally calibrated, either at the factory, or periodically, or both, and it is virtually impossible to determine whether a difference in calibration, even small differences, will have an effect on the overall testing system. Thus, even in the best of scenarios with multiple test assemblies, when identical copies of equipment are configured in the same way, using the same cables that outwardly look the same, it still may not always be possible to have repeatable measurements from one test assembly to the next.

Another problem with using multiple pieces of equipment in a test assembly is the lack of timing coordination between various components. High-precision testing typically involves very high operating clock rates, and the equipment in a test assembly generally needs to operate at the same time to ensure testing integrity. It is difficult or impossible to fully synchronize clock signals across separate pieces of equipment, even when the clock signal comes from a common source, because of the variations in time it takes each piece of equipment to accept and process the clock signal, or because of cable impedance differences, as described above, or for other reasons.

Yet a further problem with using multiple pieces of equipment in a test assembly is the excess power used to power each of the devices individually. Power requirements for a device, such as an AWG, are generally set to allow full operation when the device is drawing peak energy, plus an additional amount of power headroom. In a test assembly, therefore, because each separate component includes a maximum-sized power supply, the assembly itself generally draws more power than is necessary to operate the overall assembly. In addition to excess energy consumption, using excess power may also generate excess heat, which may also negatively affect measurement results or prevent them from being repeatable because of the various operating conditions.

Still a further problem with using multiple instruments in a test assembly is that it typically requires a disjointed and ad-hoc software environment to create the full test setup. For example, one test assembly may include a BERT from a first manufacturer using a first set of control signals while another test assembly includes a BERT from a second manufacturer with a second set of control signals. The control software for each of these test assemblies must therefore be customized so that it generates the proper control signals to operate the two different BERTs, adding complexity, delay, and expense. This further exacerbates the problem with creating reproducible results, described above.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Figure 1:
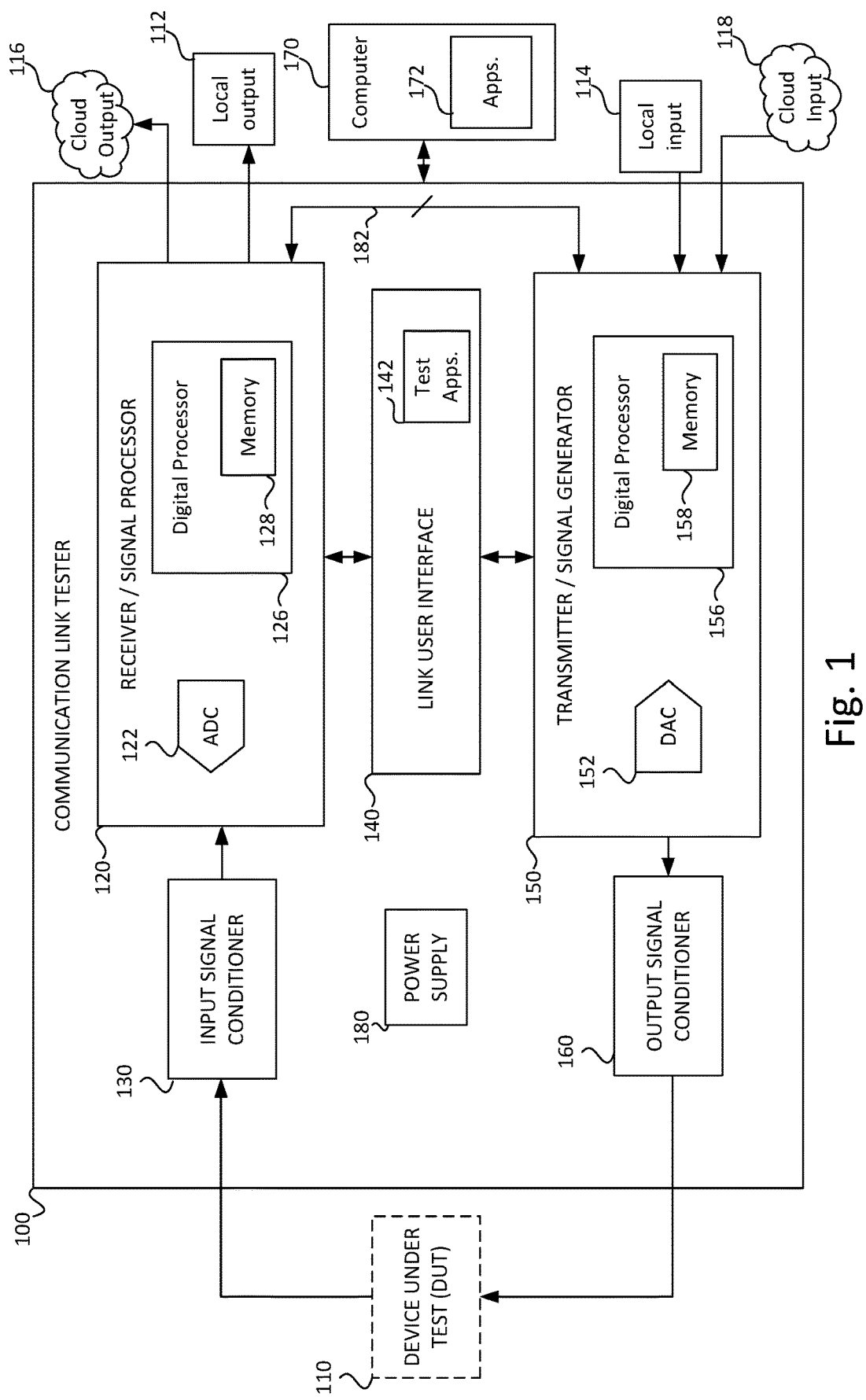
FIG. 1 is a functional block diagram of a single-channel communication link tester including a receiving portion and a transmitting portion according to some embodiments of the disclosure.

FIG. 1 is a functional block diagram of a single-channel communication link tester 100 including a receiving portion and a transmitting portion according to some embodiments of the disclosure. Although FIG. 1 illustrates a single channel, in which a single Device Under Test (DUT) 110 is connected to a signal data channel of a transmitter and a receiver, embodiments of the invention may also include multiple channels, as illustrated and further described with reference to FIG. 2. Example DUTs may include components or products that send and receive signals at very high rates, such as high-speed data communication and telecommunication networking equipment, such as switches and routers; fiber optic systems including components, links and/or channels; cables, and chip-to-chip communication links such as Serializer-Deserializers (SERDES).

In general, the communication link tester 100 generates test signals, then sends them to an input of the DUT. The DUT operates on the test signals and sends an output signal back to the communication link tester 100. The communication link tester 100 then receives and analyses the output signals sent from the DUT. In this way the communication link tester 100 can test the operations and functions of the DUT in a very controlled environment. The communication link tester 100 may be used during DUT development or manufacturing, or may be used to troubleshoot problems that may occur with finished DUT products.

The output signals sent from the DUT 110 are data input signals to the communication link tester 100. The communication link tester 100 may also perform analysis on these data input signals in real-time. In many prior test assemblies, such as assemblies that included oscilloscopes, link testers were "blind" or "offline" for much of the time the input signals are being received due to the long processing times to analyze the input signals. For example, a previous device would gather large number of samples, such has tens or hundreds of millions of data samples, but then stop accepting additional input data while the sampled data was analyzed. If an error occurred very infrequently compared to the number of samples, there was a high likelihood that the error could occur while the testing apparatus had stopped accepting samples to analyze the samples already accepted. Thus finding an infrequent error sometimes came down to luck of accepting data in which the error happened to have occurred. The "offline" periods also degrade the accuracy of statistical measurements, such as jitter, Bit Error Rate (BER), or eye diagram margins, for example. Using embodiments of the invention, conversely, the communication link tester 100 can perform the analysis and sampling of data as it is received from the DUT in real-time, without the need to stop accepting new samples while the previous samples are analyzed.

The communication link tester 100 of FIG. 1 includes a receiver portion as well as a transmitter portion. In FIG. 1 the receiver portion is generally indicated as receiver 120, which is connectable to the DUT 110 through an input signal conditioner 130. The input signal conditioner 130 may include one or more programmable amplifiers and may be able to perform some input signal pre-conditioning, such as analog Continuous Time Linear Equalization (CTLE) as described below with reference to FIG. 3. The input signal conditioner 130 may be housed in a remote head (not separately illustrated) that is physically attached to the DUT 110 for receiving input signals from the DUT, and is electrically (or optically) and physically connected between the DUT and the receiver 120. In some embodiments, the input signal conditioner 130 may be considered to be a part of the receiver 120, although in FIG. 1 it is illustrated as being separated from the receiver for clarity. In some embodiments, the input signal conditioner 130 may operate in a bypass mode, in which no signal conditioning of the input signal from the DUT need take place within the input signal conditioner. Although generally described herein as receiving electrical signals, embodiments of the invention may additionally or alternatively receive optical signals. In such embodiments the input signal conditioner 130 may also include an optical receiver to receive optical signals as well as a converter to convert the received optical signals to electrical signals for processing and/or analysis.

The receiver 120 includes an Analog to Digital Converter (ADC) 122 that converts an analog signal from the input signal conditioner 130 or directly from the DUT into a digital signal. In some embodiments, the ADC 122 is a high-precision converter that is capable of generating a high-precision or high resolution digital output signal. In some embodiments, the ADC 122 includes one or more n-bit converters, which are capable of encoding an analog signal into one of $2^n$ discrete levels. For example, if the ADC 122 includes 8-bit converters, the input signal could be encoded into one of 256 individual and discrete levels. In general, the ADC 122 is oversampled or highly oversampled compared to the bit input rate of the input signal received from the DUT. The digital signal from the ADC 122 output is then presented to a digital processor 126 for processing, as described below. The digital signal and other related signals may be stored in memory 128 before or after being processed by the processor 126. In some embodiments the digital processor 126 may process the signal both before and after being stored in the memory 128, and may, in fact, store the signal or other data multiple times between processing functions.

The receiver 120 may perform various functions on the digital signal, such as clock and data recovery, edge detection, decimation, digital equalization, down conversion, digital signal processing, channel estimation, triggering, error checking, protocol specific processing, Bit Error Rate (BER) calculating, as well as other functions, as described in detail below. The receiver 120 may be embodied in a Field Programmable Gate Array (FPGA), which enables the functionality and operation of the receiver 120 to be easily updated or modified. The FPGA may also be controlled by embedded or external software. In other embodiments, the receiver 120 may be embodied by a general purpose or special purpose processor controlled by and running particular software programs, although it may be more difficult to update and modify the receiver 120 in those embodiments compared to the FPGA embodiment. Other embodiments may operate on retargetable or reconfigurable commercial logic devices and/or custom logic devices. Example FPGAs that may be used as a platform on which to implement the receiver 120 include various versions of the FPGAs produced by INTEL or XILINX, for example.

The communication link tester 100 of FIG. 1 also includes a transmitter portion 150, which is connectable to the DUT 110 through an output signal conditioner 160. The output signal conditioner 160 may be able to perform some output signal conditioning, such as cable compensation, or other conditioning before outputting the signal from the communication link tester 100. The output signal conditioner 160 may be housed in a remote head (not separately illustrated)

that is physically attached to the DUT 110 for providing signals to the DUT, and is electrically (or optically) and physically connected between the DUT 110 and the transmitter 150. In some embodiments, the output signal conditioner 160 may be considered to be a part of the transmitter 150, although in FIG. 1 it is illustrated as being separated from the transmitter for clarity. In some embodiments, the output signal conditioner 160 may operate in a bypass mode, in which no signal conditioning of the output signal from the transmitter 150 need take place before being presented to the DUT 110. Similar to the receiver above 120, the transmitter 150 may generate optical output signals in addition to or instead of electrical output signals. In such embodiments the output signal conditioner 160 may also include an electrical-to-optical converter or generator to produce the optical output signals.

The transmitter 150 includes a digital processor 156 associated with a memory 158. The main function of the digital processor 156 is to generate signals that are output from the communication link tester 100 to the DUT 110. The signals generated by the transmitter 150 may include testing signals, such as various protocol and patterned signals as described in detail below. In some embodiments, the memory 158 may store the final signal before passing out of the processor 156. In other embodiments, the memory 158 includes data or programs used by the processor 156 to generate the final testing signal. The testing signals may be modified from standard form to stress test the DUT 110, such as by modifying the amplitude, duration, timing, or other characteristics of the signals, such as jitter and impairments, as described in detail below. The transmitter 150 may also include filters to shape and modify the signals generated by the digital processor 156 before passing the modified signals to a Digital to Analog Converter (DAC) 152. The DAC 152 converts digital signals generated by the digital processor 158 to analog signals before passing them to the output signal conditioner 160, if used, before being sent out of the communication link tester 100 to the DUT 110.

The digital processor 156 may also include one or more facilities for controlling the DAC 152, such as predistortion, linearity testing (by introducing non-linearity to the output signal), rising and falling edge control, as well as voltage swing control, among others. These facilities modify the digital signal before being sent to the DAC 152, to help the DAC produce a properly constructed signal for output of the communication link tester 100 to the DUT 110.

The transmitter 150 may be embodied in an FPGA, which enables the functionality and operation of the transmitter 150 to be easily updated or modified. In some embodiments, a single FPGA may enable the functionality and operation of both the transmitter 150 and receiver 120. Similar to the receiver 120, the FPGA embodying the transmitter 150 may also be controlled by embedded or external software. In other embodiments the transmitter 150 may be embodied by a general purpose or special purpose processor controlled by and running particular software programs, although it may be more difficult to update and modify the transmitter 150 in those embodiments compared to the FPGA embodiments. In some embodiments, the receiver 120 and transmitter 150 may be implemented on a single FPGA.

A link user interface 140 is coupled to the receiver 120 and to the transmitter 150 and, although not illustrated, also may be coupled to other components of the communication link tester 100. The user interface 140 may include a keyboard, mouse, trackball, touchscreen, switches, rotary switches, buttons, menu selectors and/or any other controls employable by a user to interact with communication link tester 100. The user interface 140 may also include or be coupled to a Graphical User Interface (GUI), which may include a digital screen, display, or any other monitor. The GUI may be used to, for example, control operation of the communication link tester 100, display test or measurement results, timestamps, captured waveforms, packet data, and display output or other results to a user as discussed herein. Further, the GUI may be used by the operator to control the function of the communication link tester 100, such as selecting particular tests to run, modifying parameters, setting trigger conditions, selecting which input and outputs to use, etc. In other embodiments the user may interact with the communication link tester through a programmatic user interface rather than a graphic user interface. A programmatic user interface is one that does not have graphical functionality. Computer programs, such as testing, setup, or calibration programs may be stored in a test application store 142 within or accessible by the user interface 140. These applications 142 may be selected by the user using the interface 140 for operating on the communication link tester 100. In some embodiments, particular applications 142 may be available to some users and not others. For example, a suite of particular applications 142 may be made available to users who purchase the additional functionality the particular applications provide. While the user interface 140 is depicted as being integrated within the communication link tester 100, it will be appreciated by a person of ordinary skill in the art that any of these components can be external to communication link tester and can be coupled to the link tester in any conventional manner, for example, by using wired and/or wireless communication media and/or mechanisms.

As illustrated in FIG. 1, the communication link tester 100 may be coupled to a computer 170, which may have one or more computer applications 172 running thereon. The computer 170 may control the operation of the communication link tester 100, or may operate in conjunction with the link user interface 140 to control the functions of the tester 100. For example, a computer application 172 running on the computer 170 may be operative to cause the communication link tester 100 to run a particular protocol system analysis or other test sequence for a connected DUT 110. The communication link tester 100 may also send data or other information directly to the computer 170. Such information could include data received by the receiver 120 from the DUT 110, or could include information about the communication link tester 100 sent to the DUT, or other information. In some embodiments, the computer 170 may be used as a scheduler, i.e., to cause the communication link tester 100 to automatically or periodically perform certain tests on the DUT 110 or to perform internal tests, such as calibration, within the link tester itself.

The communication link tester 100 may include a local output 112 and a local input 114. Each of the local output 112 and local input 114 may include multiple channels of data. The local output 112 may be used for data logging, or for receiving data generated by the communication link tester 100. The local input 114 may be used to provide data, such as testing data, to the communication link tester 100. In some embodiments, the local output 112 and local input 114 are not necessarily separate ports into the communication link tester 100, but rather are included in the connection between the link tester and the computer 170. Further, the communication link tester 100 may have an ability to send output, such as output data or data received from the DUT 110 to a cloud output 116. Additionally, the communication link tester 100 may be coupled to and receive data and/or instructions from a cloud input 118. The cloud output 116 may stream data from the communication link tester 100 and store it in a cloud-based network, such as over the internet, where the data may be available to be viewed by multiple people in distributed geographic locations. For example, a user may log into the computer 170 over the internet (not illustrated), cause the communication link tester 100 to run a certain program or test on the DUT 110, then direct that the link tester 100 store particular desired data in the cloud through the cloud output 116. Similarly, the communication link tester 100 may receive data or instructions from the cloud input 118, where data can be accessed by the link tester 100 directly, without the necessity of accessing the data through a separate computer. In some embodiments, the cloud output 116 and cloud input 118 are housed in the same physical device. Such cloud access allows the user of the communication link tester 100 to access data used by or store data generated by the link tester directly to and from the cloud data network, such as the internet or other, privately accessible data networks, without the necessity of being in the same physical location as the communication link tester 100, or without having to access data from the communication link tester 100 through the computer 170. In yet further embodiments, the cloud output 116 and cloud input 118 may be used to support coordinated and aggregated testing, measurement, and analysis across multiple distributed link testers 100 that may be separated from one another by a large distance. For example, a transmitter 150 of a first link tester 100 may be coupled to a long-haul fiber optic network while a receiver 120 of a second link tester 100 may be coupled to another end of the fiber optic network. Both link testers may also be coupled to one another through their respective cloud outputs and inputs 116, 118. In this way the fiber optic network represents the DUT 110, coupled between the first and second link testers 100, while the link testers 100 are also coupled together through their cloud outputs and inputs 116, 118, respectively. Further, although in FIG. 1 the cloud input 118 is illustrated as being directly coupled to the transmitter 150, it may also be coupled to the receiver 120 or elsewhere in the link tester 100. Similarly, although the cloud output 116 is illustrated as being directly coupled to the receiver 120, it may also be coupled to the transmitter 150 or elsewhere in the link tester 100. In other words, any portion of the communication link tester 100 may send and receive signals directly from the cloud or a communication network such as the internet.

In some embodiments, all of the functional blocks of the communication link tester 100 illustrated in FIG. 1 may be integrated into a single physical unit, which may be stand-alone or mounted in a testing rack. The communication link tester 100 includes a power supply 180 that powers all of the circuitry of the physical unit, for both the receiver 120, the transmitter 150, as well as the other components illustrated in the communication link tester 100 of FIG. 1. Additionally, the receiver 120 and the transmitter 150 are coupled to one another through a high-speed parallel bus 182, which is used to carry data, communications, instructions, control information, etc., between the receiver and 120. Although not individually shown, the parallel bus 182 may also carry one or more clock signals generated by either the receiver 120 or the transmitter 150, or elsewhere in the communication link tester 100 and sent to other components within the communication link tester 100. In other embodiments, the communication link tester 100 may be physically assembled in multiple components. For example, the transmitter 150 may be housed in a first component while the receiver 120 is housed in a physically separate component.

Figure 2:
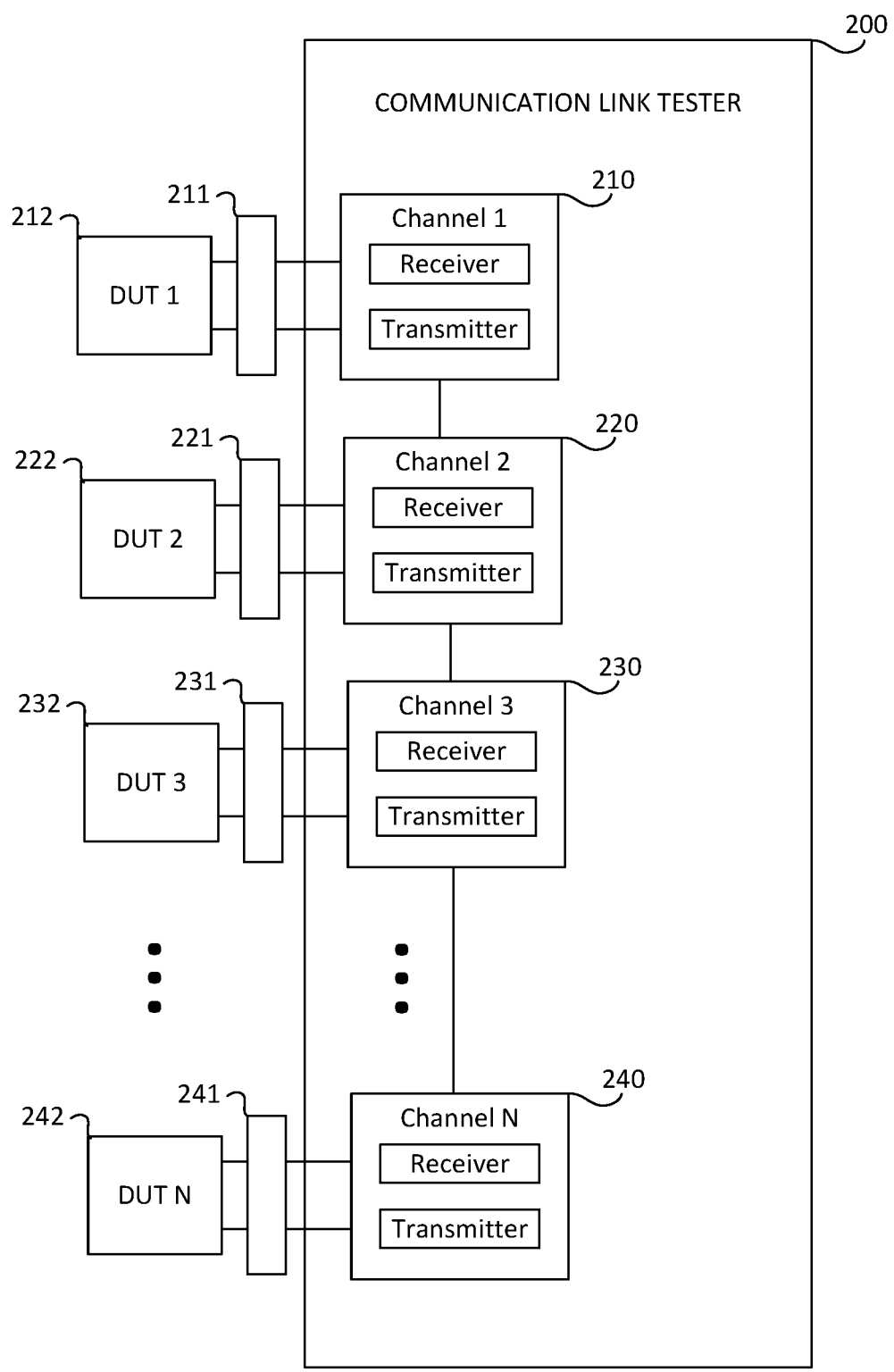
FIG. 2 is a functional block diagram of a multi-channel version of the communication link tester according to FIG. 1.

Although FIG. 1 illustrated a single transmitter and receiver coupled to a single DUT, a communication link tester according to embodiments of the invention may include multiple channels. A communication link tester 200 illustrated in FIG. 2 may include multiple channels. The communication link tester 200 of FIG. 2 includes at least four channels, labeled Channel 1, Channel 2, Channel 3, and Channel N. There may be any number of channels included in the communication link tester 200 depending on the implementation. In FIG. 2, each DUT is illustrated as being coupled to a particular channel, however it is possible that any particular channel may receive signals from any of the DUTs connected to the communication link tester 200. The channels may be coupled to one another internally within the communication link tester 200 and as illustrated in FIG. 2. So, it is possible that DUT 3 232 is coupled to Channel 1 210. Also, for example, the transmitter of Channel 1 210 may generate signals for DUT 3 232, and the receiver of Channel 1 210 may receive signals from the DUT 3 232. Further, testing channels may be synchronized and aligned, meaning, output signals from DUTs 1-N are synchronized and aligned in waveform timing as well as possibly synchronized and aligned in channel packet data and may be received by any or all of the receivers in any or all of the channels 1-N. The synchronization and alignment may be controlled by an input signal conditioner 130 and/or the receiver 120 (FIG. 1) of any of the channels 1-N. The input signal conditioner 130 may accept single-ended or differential signals from any or all of the DUTs 1-N, and may be Alternating Current (AC) or Direct Current (DC) coupled. In some embodiments, the receiver 120, through its input signal conditioner 130, may accept samples in excess of 0.5-500 GigaSamples/sec (GS/s), and may accept input signal bandwidth up to 100-200 GHz simultaneously on all channels 1-N.

Grouping of various inputs from the DUTs 1-N of FIG. 2 may be performed by Synchronous Time Interleave (STI) functionality that is present within the input signal conditioner 130 or as a separate component. The STI allows single or multiple differential input channels from the DUTs 1-N to be grouped and synchronously interleaved for analysis by the receiver 120 of any of the channels within the communication link tester 200. The STI functionality may be programmable and/or selectable, which may be controlled by the user through the user link interface 140, the computer 170, applications 172 running on the computer 170 or elsewhere, applications 142 running on the link interface 140, or through any other control method. The communication link tester 200 may also have the ability to synchronize and align multiple input and output channels in time by using signal processing functions in the receiver 120 and transmitter 150. Such synchronization and alignment may also involve adjustments in the ADC 122 (FIG. 1) as well as the DAC 152.

Grouping of inputs from multiple DUTs through the input signal conditioner 130 enables testing of standards that stream data over multiple stripes in separate channels, with particular striped data being sent to and/or received from any or all of the DUTs 1-N. Coupling multiple DUTs to various channels in the communication link tester 200 also allows for testing and implementation of entire protocol stacks as outlined by particular communication or testing standards.

The receiver 120 through its input signal conditioner 130 may receive input signals from the DUTs 1-N having an input signal dynamic range between 0-20V, for example. In some embodiments the input signal dynamic range may be between 50 mV and 4.5V or larger. The input signal conditioner 130 may include attenuators as well as a number of programmable amplifiers to condition the signal for analysis by the receiver 120.

As mentioned above, the input signal conditioner 130 may include CTLE performed in the analog domain, such as described in U.S. patent application Ser. No. 15/395,416, filed Dec. 30, 2016, entitled NOISE REDUCTION IN DIGITIZING SYSTEMS, assigned to the assignee of the present invention, which is incorporated herein by reference. Using a CTLE allows the input signal conditioner 130 to enhance bandwidth by boosting frequencies to optimize the frequency response and noise performance of the entire signal path, thus providing a signal path bandwidth in excess of 100 GHz. The analog CTLE equalization may also be used to boost frequencies to de-embed the input channels in the DUT 110. In some embodiments, the boosting frequencies are a function of baud rate, thus the analog CTLE has an ability to support boosting frequencies over a large frequency band, which allows the communication link tester 100 to be used in testing a large number of varying communication standards, such as IEEE 802.3bs, IEEE 802.3bj, OIF CEI-56G and CEI-112G, OIF CEI-11G, OIF CEI-6G, PCI-e, as well as other high-speed data communication standards. Including analog CTLE functions within the input signal conditioner 130 allows frequency response shaping of the input signals to increase the Signal to Noise Ratio (SNR) performance of the input signal conditioner 130 and receiver 120. Shortcomings in frequency shaping of the input signals may be compensated in the input signal conditioner 130 by using analog CTLE. The analog CTLE function of the input signal conditioner 130 may be programmable and/or selectable, which may be controlled by the user through the user link interface 140, applications 142 running on the link interface, the computer 170, applications 172 running on the computer 170 or elsewhere, or through any other control method.

Also as illustrated in FIG. 2, a set of optical inputs and outputs 211, 221, 231, and 241 may be coupled between the communication link tester 200 and any or all of DUTs 1-N. The optical inputs and outputs 211, 221, 231, and 241 allow the communication link tester 200 to communicate to the DUTs using optical, rather than electrical signals. This increases the functionality of the communication link tester 200. Inclusion of such optical inputs and outputs 211, 221, 231, and 241 further allows the communication link tester 200 to test coherent optical standards, such as QAM, at rates up to or in excess of 64 GigaBaud/second (GBd/s).

Figure 3:
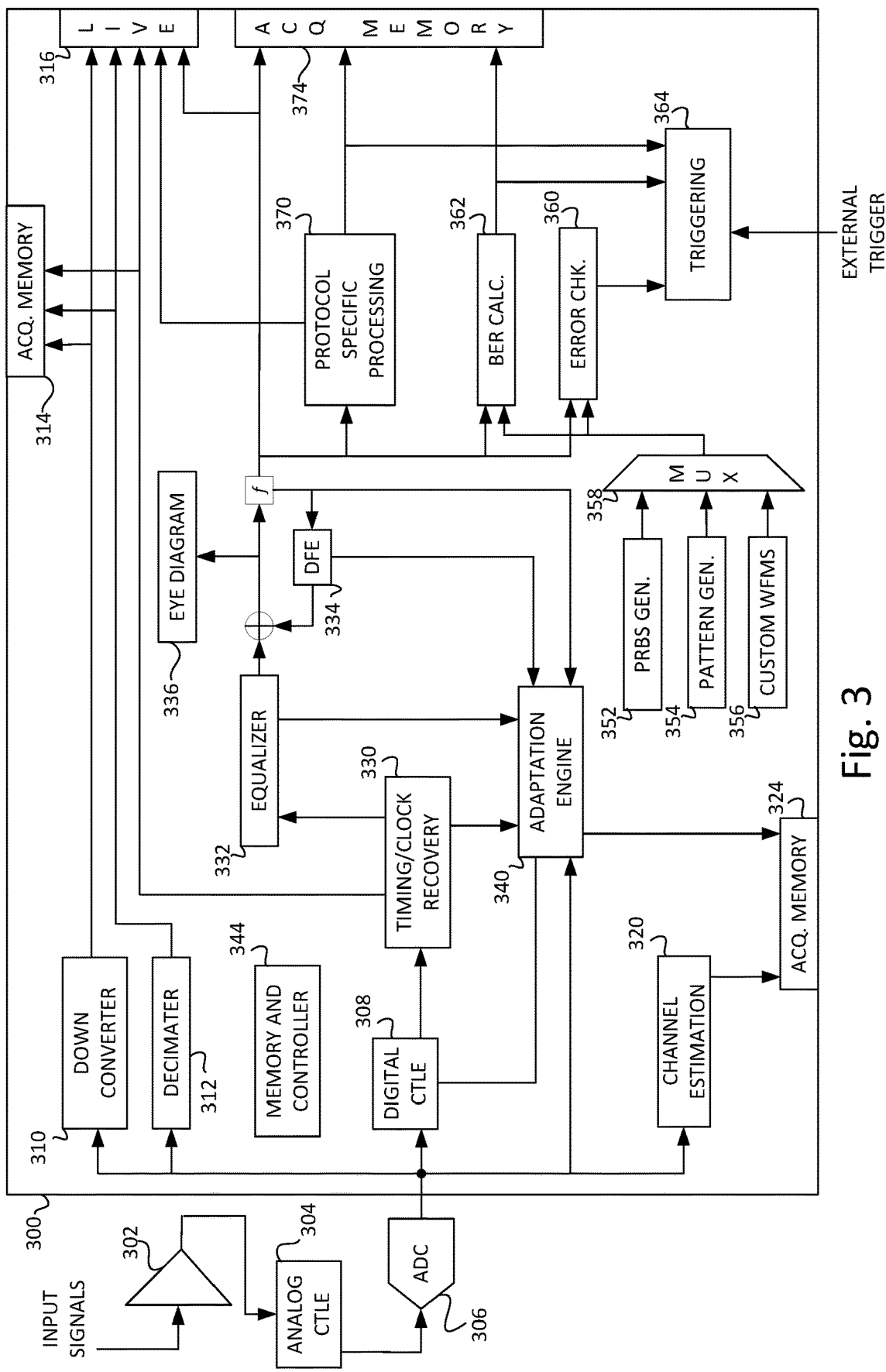
FIG. 3 is a functional block diagram of a receiver component of the communication link tester of FIG. 1 according to embodiments of the invention.

FIG. 3 is a functional block diagram of a receiver component of the communication link tester of FIG. 1 according to embodiments of the invention. The receiver 300 illustrated in FIG. 3 may be an example or embodiment of the digital processor 126 of FIG. 1, and may perform the functions described above with reference to the digital processor 126 of the receiver 120. Also as described above, the receiver 300 may be embodied in an FPGA, which allows the receiver 300 to be quickly upgraded and enhanced by re-programming the FPGA itself.

The receiver accepts one or more input signals at a programmable amplifier 302, which may function as described above with reference to the input signal conditioner 130. Further, the programmable amplifier 302 may include a programmable analog CTLE function that performs equalization on the input signals before being presented to an ADC 306, or an analog CTLE block 304 may be separate from the programmable amplifier 302, as illustrated in FIG. 3. The CTLE performed in the analog CTLE block 304 is an analog CTLE, meaning it is performing equalization on the analog signals received from one or more DUTs. The analog CTLE 304 shapes the frequency response of the input signals and helps reduce noise and enhance the SNR before passing the equalized input signals to the ADC 306. The ADC 306 may be embodied by multiple separate ADCs that can interleave input signals received from a pre-sampler in the input signal conditioner 130 that samples the input signal at a very high sample rate in the analog domain and distributes interleaved phase waveforms to multiple ADCs at a lower sample rate. After the input signal is processed by the programmable amplifier 302, analog CTLE 304, and the ADC 306, it is presented to the receiver 300 in digital form. The ADC 306 has the ability to operate at a high sample rate compared to the baud rate of the input data signals. As described above, the ADC 306 may be, for example, an 8, 10, or 12-bit converter capable of effectively generating a digital capture of an analog input waveform. The ADC 306 need not be an even number of bits, and thus could alternatively have 7, 9, 11 or 13 bits, for example. Embodiments of the invention are not limited to any particular resolution, and the ADC 306 may include any number of bits. With reference to FIG. 3, the programmable amplifier 302 and the ADC 306 operate in the analog domain, while the remainder of the components within the receiver block 300 operate in the digital domain.

After the analog input signal is received and digitized by the ADC 306, it is passed to the receiver 300 for processing in the digital domain. The various functional blocks of the receiver 300 illustrated in FIG. 3 operate cooperatively to process the input signal. As described above, although illustrated here as a separate processing blocks, the individual functional blocks illustrated in FIG. 3 may be a function programmed into one or more custom logic devices, such as FPGAs or other digital processor(s). Those of skill in the art recognize that FIG. 3 is a functional block diagram that illustrates the functions of the receiver 300, and do not necessarily align with physical boundaries or identify discrete components. Further, although some of the functional blocks are illustrated as connected to one another, it will be appreciated by those having skill in the art that the output from any of the functional blocks of FIG. 3 may be accessed by any of the other blocks. By having the receiver 120 implemented with a high-speed ADC coupled to one or more FPGAs, algorithms and functions of the receiver can run in real time relative to the input data signals received by the communication link tester 100. This combined functionality, together with the benefits of tight integration of the components within the communication link tester 100 can replace the need to use a combination of a BERT, sampling scope and/or real-time scope to perform only a set of limited functions. Instead, using the approach of integrating the receiver 120 and transmitter 150 in the same instrument, either physically in a single instrument or virtually with tightly coupled receiver and/or transmit instruments, many more functions are available to the user to test a DUT or link channel more accurately, efficiently, and with less cost compared to previous test assemblies.

After the digitized input signal is received at the receiver 300 it may be digitally downconverted to select a particular frequency band of interest through a Digital Down Converter (DDC) 310. Including a DDC 310 in the receiver 300 allows the user of the communication link tester 100 to perform spectral tests and analysis of RF signals. In some embodiments, the DDC 310 uses a Numerically Controlled Oscillator (NCO) to select a center frequency of interest from the input signal prior to decimating the data to a reduced sample rate. The DDC 310 can accept real input data from a single ADC or complex in-phase/quadrature (I/Q) data from two ADCs if an RF local oscillator (LO), mixer, and filter stages are used for analog down-conversion in the input signal conditioner 130 and then the resulting intermediate frequency (IF) I and Q waveform components are sampled with separate ADCs. The DDC 310 can be used to select a precise frequency window of interest with reduced sample rate, allowing a longer time span to be acquired to a fixed memory size as well as making it easier to implement downstream measurement and analysis functions.

Similarly, a decimator 312 may include a decimation filter to resample the digital input signal to a lower sample rate signal for use by the link tester 100. The particular frequencies, output sample rate, and filter coefficients of the DDC 310 and decimator 312 may be controlled by the user through the link user interface 140, applications 142, or through an extern computer 170 or applications 172 running on the computer as described above.

Output from the DDC 310 and decimator 312 may be sent to an acquisition memory 314, which stores the input signal after down conversion or decimation. Additionally, the output from the DDC 310 and decimator 312 may be sent to a live stream data output 316, which may be an embodiment of the local output 112 of FIG. 1, so that a user can have direct streaming access to the down-converted or decimated data. The DDC 310 or decimator 312 functions may be bypassed to send full sample rate data captured by the ADC 306 to any of the acquisition memories 314, 324, and/or 374, or to the live stream data output 316. Further, the live stream data output 316 may also be an embodiment of the cloud output 116 of FIG. 1, where the data is streamed to a cloud storage network where the data may be accessed by anyone who has authorization to access the data, for example over the internet, as it is being streamed. Or the live data may be sent out of the live stream data output 316 and stored in a cloud storage process for later access. In some embodiments, the live stream data output 316 may be both a local port 112 on the link tester 100 as well as a having a cloud output 116 component that may be selected by the user so that data that is streaming from the physical local port 112 is additionally, or alternatively, streamed to the cloud through the cloud storage port 116.

The data that is generated by the ADC 306 and presented to the receiver 300 may also go through another CTLE equalization process performed by a digital CTLE processor 308. The digital CTLE processor 308 differs from the CTLE function or process performed in the analog CTLE block 304, described above. In general, the CTLE process performed in the analog CTLE block 304 is an analog process, performed in the analog domain, while the CTLE equalization process performed by the digital CTLE processor 308 is performed in the digital domain. That is, the digital CTLE processor 308 provides equalization on the input signal after it has been converted to a digital signal by the ADC 306. The digital CTLE processor 308 performs equalization of the digital input signal as described above, and also in reference to the incorporated '416 application. In general, the digital CTLE processor 308 uses various techniques to modify the digital input signal to reduce noise and improve SNR of the input signal as well as to compensate for the input analog signal path. The digital CTLE processor 308 can be used in conjunction with the analog CTLE function 304 that may be within the input signal conditioner 130.

A channel estimation block 320 receives digital input signals from the ADC 306 and is used to estimate the noise, frequency response, or other channel conditions of the communication channel between the DUT and the receiver 300. As described below, once noise and other channel conditions are known, they may be sent to the transmitter 150, so that they may be taken into account when the transmitter is sending information on the communication channel to the DUT. The channel estimation block 320 may be used to initially characterize the communication channel, and cause the transmitter 150 and/or DUT 110 to take the channel characterization into account during the initial transmitter setup, or the channel estimation block may be used continuously so that the communication channel is constantly monitored and the results sent to the transmitter so that the transmitter may alter its transmitting parameters or be used to alter parameters within the DUT in response to changing channel conditions. Channel estimation characteristics determined by the channel estimation block 320 may also be used to increase the efficacy of equalization, generation of stressed impairments, as well as clock and data recovery, as described below. The channel estimation block 320 may coordinate with the transmitter 150 to send particular data or a signal, such as a sine wave, at various frequencies and measure the effect that the communication channel coupled to or within the DUT has on the signals sent to it. As above with reference to the DDC 310 and decimator 312, the output of the channel estimation block 320 may be sent to acquisition memory 324 or other memory within the receiver 300 so that the instant channel information may be stored and later accessed.

A timing and clock recovery processor 330 receives the input signal after it has been modified by the digital CTLE processor 308. The clock recovery processor 330 performs a Clock Data Recovery (CDR) process, as described below in detail, to generate a clock signal from the received input signal. In general, the clock recovery processor 330 uses one or more phase detectors on the received input signal that operate at an over-sampled clock rate relative to the input waveform to generate a clock signal that very accurately estimates the clock signal that was used by the DUT to generate the input data waveform. Since the ADC 306 over-samples the input waveform relative to its baud rate, the timing and clock recovery processor 330 may use interpolative clock and data recovery methods. The clock recovery processor 330 may initially recover or generate a data waveform clock based on the input symbol period, then resample the input signal from the sample rate of ADC 306 to the recovered baud rate clock. The clock recovery processor 330 determines the baud rate from the input signal analysis. In general, the clock recovery processor 330 reduces the sample rate internally and determines the actual baud rate by operating in conjunction with the Decision Feedback Equalizer (DFE) 334, discussed below, to determine which phase and symbol clock rate with respect to the input samples provides the best margins with respect to the eye diagram. Not all embodiments require a DFE, however. The clock recovery processor evaluates multiple potential symbol clock rates and determines the optimal symbol clock rate to use to track the input waveform. A loop filter in the clock recovery processor 330 may have adjustability in the bandwidth and other filter characteristics to track clock variation and support varying standards and test requirements. The clock recovery processor 330 may include a phase detector, using known techniques such as Bang Bang, Mueller-Muller, Gardner, and Minimum Mean Squared Error, for example.

An equalizer 332 may perform further equalization on the recovered clock signal, in conjunction with an adaptation engine 340, described further below. The equalizer 332 may be a feed-forward equalizer adaptable to automatically help the receiver 300 adapt to changing conditions, such as temperature, which may affect the accuracy of the receiver. The user of the link tester 100 may be able to control, or set parameters for operation of the equalizer 332 through the user interface 140 (FIG. 1). The equalizer generally performs equalization at the baud rate, i.e., the rate of sampled groups of data, although fractionally spaced equalization can also be implemented with the described architecture. This equalization may be different than the equalization performed by the CTLE 308, described above, which instead runs at the rate of the input samples from the ADC 306 or some multiple of the symbol baud rate, for example for equalization filters with fractional UI resolution. A filter may also be used to de-embed cables, package models, or other interconnect that is between the instrument and the DUT. Also, a filter may be used to embed models of interconnect and packages not in the physical measurement.

Output from the equalizer 332 and clock recovery processor 330 may be used in conjunction with the Decision Feedback Equalizer 334 to generate a visual data output called an eye diagram 336, which may be in the form of a histogram. The eye diagram output itself may be displayed on the user interface 140 (FIG. 1), stored in a memory 320 for later analysis, stored elsewhere on the link tester 100, in the cloud through the live stream data output 316, or in an attached computer 170. In general, eye diagrams are a graphical illustration of the input waveforms used in test and measurement applications for many high speed data communication standards to evaluate link performance. One problem with previous testing apparatus for testing input signals is that they cannot process the input signals and generate an eye diagram in real time, due to the large amount of computer processing it takes to generate the eye diagram from the received signals. The eye diagram analysis function could include real-time jitter and noise analysis and measurement capabilities or more complex link performance metrics such as TDECQ (Transmitter Dispersion Eye Closure) and COM. Embodiments of the invention, conversely, can operate continuously at such high sample rates relative to the input waveform baud rate that the eye diagram 336 is generated in real time using the clock recovery processor 330, equalizer 332, and the Decision Feedback Equalizer 334. Further, these functional blocks of the clock recovery processor 330, equalizer 332, and the decision feedback equalizer 334 may be used to accurately perform clock data recovery, as described in detail below.

The adaptation engine 340 may operate independently or with user input through the link user interface 140 (FIG. 1). The adaptation engine 340 may accept particular filter coefficients, or may calculate or select them automatically using pre-stored values. The adaptation engine 340 may also work in conjunction with the transmitter 150 (FIG. 1) by learning characteristics of the waveform transmitted by the transmitter. So, when the transmitter 150 sends a known signal to the DUT, the adaptation engine 340 may use the known values in modifying filter or other coefficients within the adaptation engine to maximize the integrity of the received signal. In other modes, the adaptation engine 340 may be used to emulate the behavior of particular known receivers. For instance, if the user of the communication link tester 100 wishes to view input signals from the DUT 110 (FIG. 1) as they would appear to three different known receivers, the adaptation engine could pre-store particular coefficients to emulate the known receivers. Then the user could select the various receivers to emulate and analyze how the characteristics of the recovered waveform would change as if the input signal were being received by one of the known receivers.

The adaptation engine 340 may operate in various modes. For example a user may select a fixed mode where a particular receiver is emulated as described above. In another mode, the adaptation engine 340 may operate in an automatic mode where particular coefficients and settings are automatically varied and the effect of such changes internally tested to determine an optimal or best set of settings for a particular purpose.

One of the main functions of a receiver in a test and measurement system such as embodiments of the invention is to be able to capture input data only after certain events or situations have occurred. This concept is called triggering, and works as follows. In general, and as described above, the amount of information that is sent by the DUT to the receiver 120 can be voluminous. Sometimes test information is sought only during special conditions, such as when the input signal exceeds a threshold value, or when two signals are received too quickly in succession, i.e., a timing error. A trigger system allows the receiver 300 to capture data only when the trigger conditions are satisfied, and data that does not satisfy the trigger is allowed to be discarded or overwritten. In these embodiments, only when the trigger conditions are satisfied does the receiver store the input data. Triggers may be related to the input data itself, such as those triggers described above, they may be related to timing, such as capturing the first data after a reset condition, could be based on anomalies detected in the input waveform, or based on detecting a certain pattern or sets of patterns in the protocol encoded in the input waveform. Two characteristics that define triggers include trigger flexibility, which is how triggers may be defined, as well as trigger dead times, which describes how long the receiver must go between acquisitions. In other words, in some conventional test equipment such as oscilloscopes, there is a period of time that is 'invisible' to the receiver because its data cannot be simultaneously evaluated against the trigger as well as stored as having satisfied the trigger condition. Embodiments of the invention address both issues. First, the triggers are extremely flexible, and allow precise control and combination as described below. Second, embodiments of the invention analyze the input data in real time and can make decisions based on the input data itself as well as trigger conditions. Unlike previous receivers, there is no dead time between acquisitions because the receiver 300 continuously operates at an extremely high sample rate, and is able to store data in real time as it continues to analyze and processes data that continues to be received. Thus, there are no missed triggers and there is no "acquisition dead time" using embodiments of the invention.

FIG. 3 illustrates several different types of triggers that may be pre-set into the communication link tester 100, or may be set up by a user through, for example, the link interface 140 or attached computer 170 (FIG. 1). A Pseudo-Random Binary Sequence (PRBS) is a generated binary sequence of numbers that exhibits statistical behavior that is similar to a sequence that is truly random. They are widely used in the telecommunications and other high speed data communication industries and especially in testing communication standards. Embodiments of the invention include a Pseudo-Random Binary Sequence (PRBS) pattern generator 352, which allow the user to select or generate various PRBS patterns used in bit error rate (BER) analysis. In operation, the user selects a PRBS pattern and the receiver receives input data. The PRBS pattern generator 352 is synchronized to the recovered input waveform to align its phase. Once aligned in phase, the recovered input data can be checked against the PRBS pattern to detect bit errors using the error checker 360 processor. The error checker 360 processor can cause a trigger to occur once a bit error is detected, and then the receiver 300 would automatically store input data for a pre-defined time before and after the bit error occurred.

The error checker 360 processor can also accept other waveforms to compare the input waveform against for error checking, such as a pattern generator 354 for common pattern types or a custom waveform pattern memory 356. The custom waveform pattern memory 356 allows the user to specify any waveform to use in the error checking or for triggering. The waveforms used in triggering may be digital or analog. In general, the pattern generators 352, 254, and 356 are synchronized to the input data and compared. When a match occurs, or in some cases when a match doesn't occur, the trigger is satisfied.

The pattern generators 352, 354, 356 may be selected by a multiplexer 358, which selects one of the pattern generators to be operative. The receiver 300 performs error checking through an error checker 360 as well as Bit Error Rate (BER) calculations in a processor 362. These are explained in further detail below.

In addition to error checking and BER calculation and related triggering capabilities through blocks 360, 362, other, general triggers are also possible, as illustrated in block 364. For instance, an external trigger may be set to cause the receiver 300 to store input data, or perform another function when the external trigger is satisfied. Triggers in block 364 may also include Protocol Based Triggering (based on a protocol recovered in block 370), Forced Triggering, and triggers on the sampled input data similar to capabilities in traditional oscilloscopes. Further, the trigger block 364 may be set to trigger on an error, in which case the receiver 300 stores the input data after an error has occurred. An error may occur when the data input to the receiver 300 does not match the input data that it was expecting from the pattern generators 352, 254, 356, which is evidence that an error has occurred. In some embodiments, the input data is received at a circular memory buffer and, when the error occurs, some of the input data from before the error occurred is also stored, to perhaps provide increased tools for analysis. More detail on triggering on errors is provided below.

A protocol specific processing block 370 allows the receiver 300 to perform specific testing when the input signal comports to a particular protocol. The protocol may be automatically identified by the receiver 300. For example, the receiver 300 may continuously compare inputs from the ADC 306 to trigger based on patterns as described above. Then, when the trigger condition is satisfied, i.e., when the receiver 300 is receiving data that matches the pre-defined data, the receiver 300 changes state to reflect that a particular protocol is being received. Then, the protocol specific processing block 370 can perform certain functions on the data based on the protocol being received. Examples of particular protocols include the various forms of Ethernet, Peripheral Component Interconnect (PCI), Peripheral Component Interconnect Express (PCI-e), High Definition Multimedia Interface (HDMI), Serial Front Panel Dataport (FPDP), and coherent optical standards for example. In some embodiments, the communication link tester 100 may be used to evaluate or test network protocols, bus protocols, wireless protocols, or hardware for Internet Protocols, as well as others, for example.

As with other components, the protocol specific processing block 370 may output data to an acquisition memory 374 and/or to the live stream data output 316. For instance, the protocol specific processing block 370 may pass input data to the acquisition memory 374 and/or live stream data output 316 only when the receiver 300 is receiving an Ethernet based frame (or sub-set of frame protocol) and ignore idle periods in the input waveform.

Although three separate acquisition memories 314, 324, and 374 are illustrated in FIG. 3, it is understood by those having skill in the art that the memories may be embodied by a single memory, separate memories, or any combination thereof. Further, memory stored in the acquisition memories 314, 324, and 374 may be able to be retrieved by any of the processes and operations illustrated in FIG. 3. Further, although not specifically illustrated in all cases for space limitations, any of the components within the receiver 300 that store data into any of the acquisition memories 314, 324, and 374 may also stream data out of the live stream data output 316. A further memory and controller 344 is additionally illustrated in FIG. 3. This memory and controller 344 may be used instead of or in conjunction with the acquisition memories. For example, particular settings or coefficients may be stored in the memory and controller 344. These need not necessarily be classified as 'acquisition' memories, and are thus illustrated separately. One having skill in the art will understand how to use various memories associated with particular components, or for the receiver 300 in general.

Figure 4:
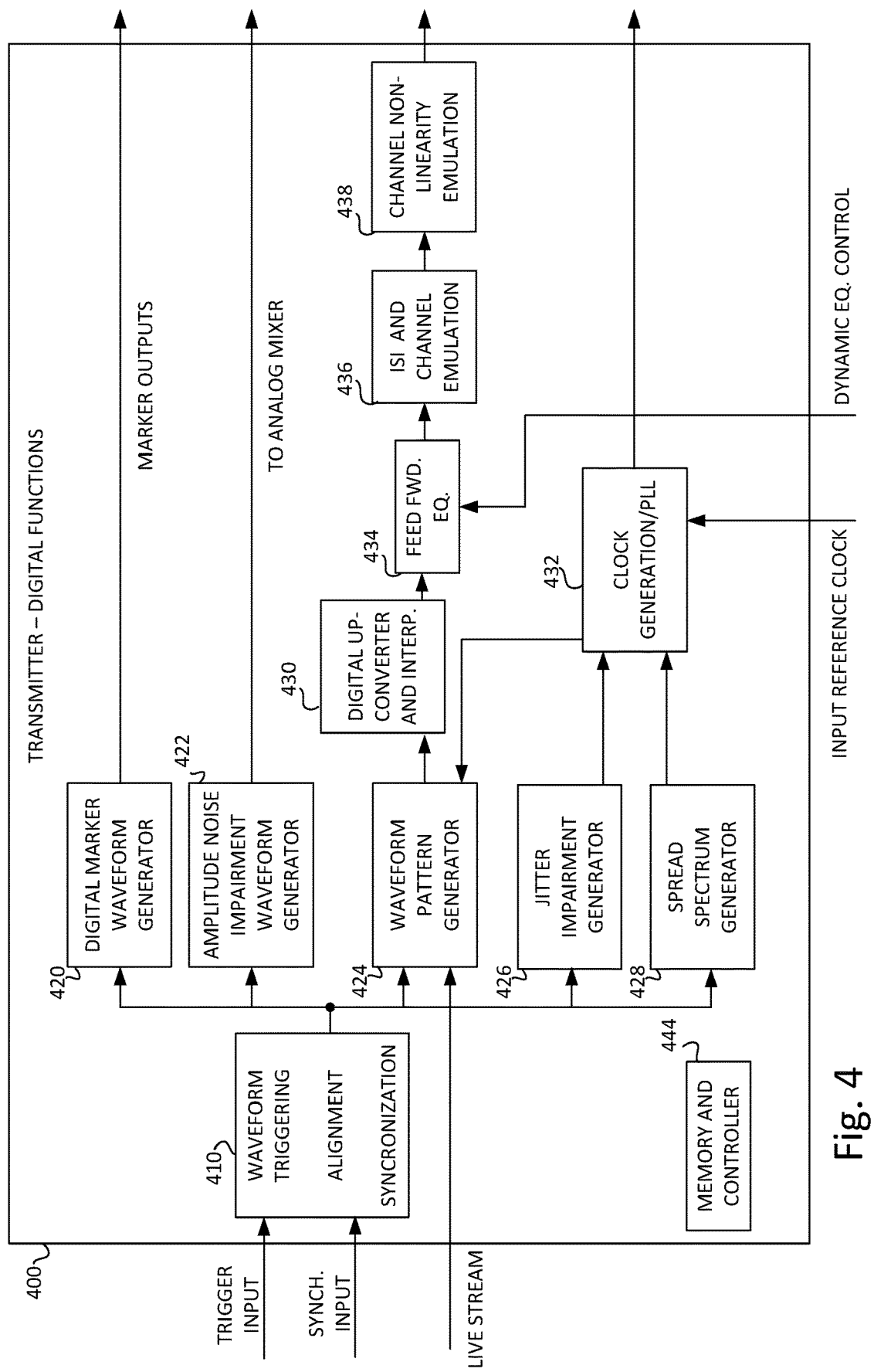
FIG. 4 is a functional block diagram of digital components of a transmitter component of the communication link tester of FIG. 1 according to embodiments of the invention.

FIG. 4 is a functional block diagram of a transmitter component of the communication link tester of FIG. 1 according to embodiments of the invention. The transmitter 400 illustrated in FIG. 4 may be an example or embodiment of the digital processor 156 of FIG. 1, and may perform the functions described above with reference to the digital processor 156 of the transmitter 150. Also as described above, the transmitter 400 may be embodied in one or more FPGAs, which allows the transmitter 400 to be quickly upgraded and enhanced by re-programming the FPGA itself. The architecture enables generating data waveforms and added impairment stress testing as defined by each particular standard via digital signal processing (DSP) techniques in addition to various analog methods. Furthermore, since the transmitter includes a high-speed DAC, many different types of waveforms can be generated similar to an AWG. Embodiments of the invention can also replace the need of using a BERT as a signal source as was true in prior testing apparatus setups for some test and measurement applications. Further, having DSP functions tightly coupled to a high speed DAC enables the communication link tester 100 to support standards from low baud rate to high baud rate state of the art standards without having to explicitly change the DAC sampling rate. Instead lower baud rate data waveforms can be resampled to the higher sample rate DAC using DSP techniques in the transmitter 400.

A waveform triggering, alignment, and synchronization block 410 prepares the transmitter 400 to generate a waveform that may be modified and ultimately sent to the DAC 440 (FIG. 5) for sending to the DUT 110 (FIG. 1). The main function of the waveform triggering, alignment, and synchronization block 410 is to calibrate and align one or more channels so they are tightly aligned in time for generating the final output waveform from the transmitter 400. The waveform triggering, alignment, and synchronization block 410 also supports external triggers for timing synchronization and pattern control. The waveform triggering, alignment, and synchronization block 410 may receive a trigger signal from the receiver 300, which causes the transmitter to initiate waveform generation in response to functions in the receiver 300. Note, too, that, as described above with reference to the receiver 300, the trigger signal may be an external trigger, i.e., a trigger that is sent to the communication link tester 100 from an outside source. The waveform triggering, alignment, and synchronization block 410 may also receive a synchronization signal to allow the transmitter 400 to closely align its output signal to any expected input for the receiver 300, and also to allow the output signal of the transmitter 400 to be closely aligned across multiple output channels, as described above with reference to FIG. 2.

Figure 5:
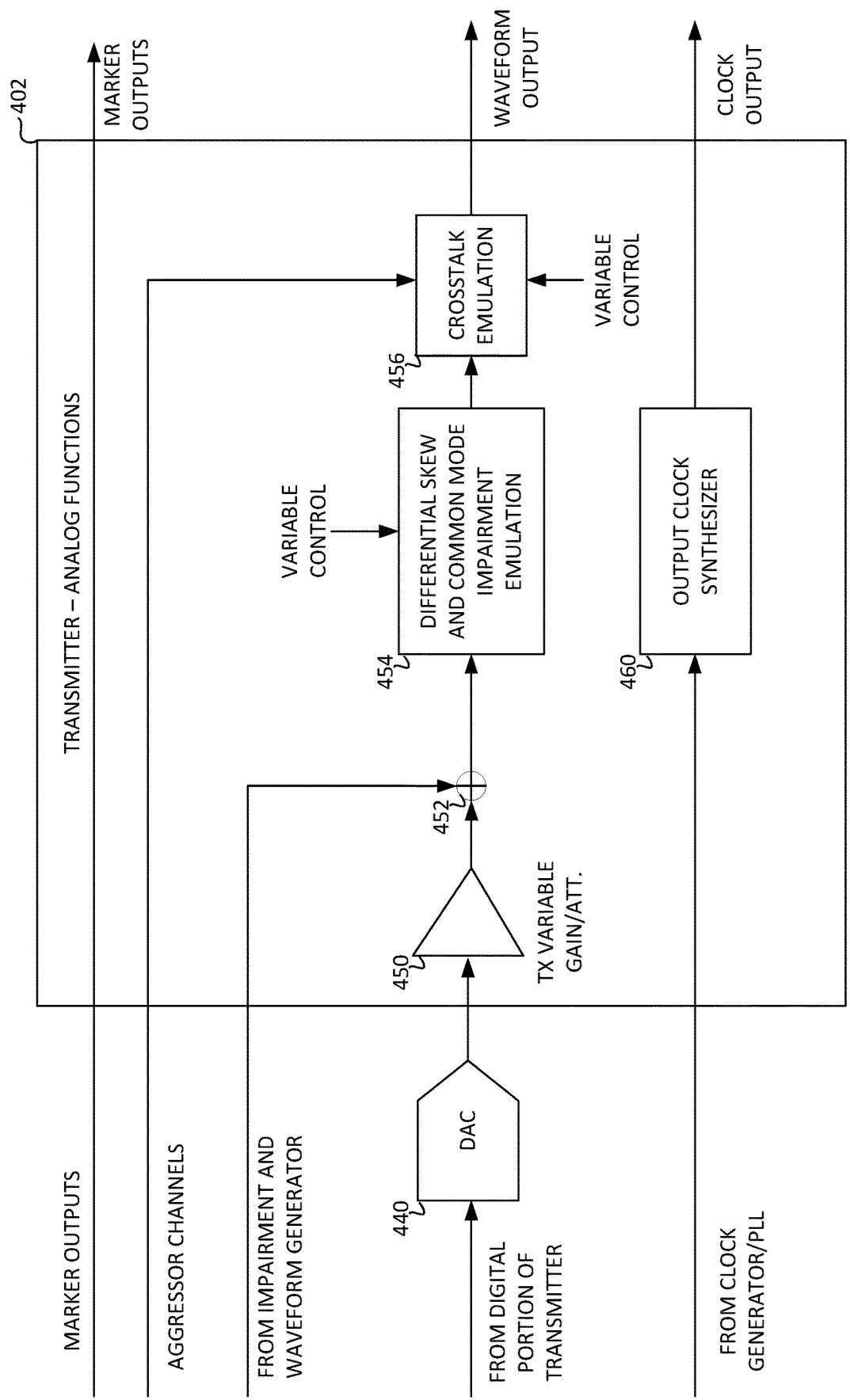
FIG. 5 is a functional block diagram of analog components of a transmitter component of the communication link tester of FIG. 1 according to embodiments of the invention.

A set of generators 420, 422, 424, 426, and 428 are responsible for generating the particular desired waveforms and impairments that will be output by the transmitter 400. A digital marker waveform generator 420 is used to generate one or more digital marker waveforms associated with and synchronized to an output analog signal. For example, a trigger may start the generation of a long, complex pattern for the output analog signal. A digital marker could be used at the end of the waveform to indicate to a DUT, or elsewhere within the communication link tester 100, to synchronize the processing of a waveform, or that particular processing should be triggered at a particular time. With reference to FIG. 5, note that the output(s) from the digital marker waveform generator 420 becomes one of the final outputs of the transmitter 400. The digital marker output(s) from digital marker waveform generator 420 can also be used to mark particular portions of interest of an output signal. Using this function provides a channel separate from the ultimate analog signal to describe portions of the analog signal that may be of interest to the operator, or may allow particular portions of the output signal to be flagged.

An amplitude noise impairment waveform generator 422 generates particular impairments that may be added to an existing waveform or may wholly generate impaired waveforms. Waveform impairments generated by the amplitude noise impairment waveform generator 422 are especially useful in stress testing the DUT 110, such as providing signals to the DUT that are not perfectly formed, for example, to simulate real-world use conditions for the DUT 110. In this way the transmitter 400 may generate imperfect waveforms to test how well the DUT 110 performs when its input is not perfectly formed. In some embodiments, the amplitude noise waveform generator 422 functions to add amplitude noise to the output waveform, which is particularly helpful for stress testing devices as they are being developed or tested. Another advantage to separately generating noise impairments for the waveform is that the noise can have a different scale and resolution in dynamic range than merely including a noise adding function to the DAC 440, discussed in FIG. 5. In other words, the amplitude noise impairment waveform generator 422 may generate a small amount of noise compared to the output signal, or a large amount of noise, and the generation of the noise is completely independent of other portions of the output waveform generation.

A waveform pattern generator 424 generates waveforms that accord to a specific waveform pattern desired to be output from the transmitter 400. In effect, any desired waveform or waveform pattern may be selected by a user through the link user interface 140 (FIG. 1), which is generated in the waveform pattern generator 424. Of particular note, the waveform pattern generator 424, in some embodiments, may be oversampled with respect to the output baud rate of the waveform. This oversampling allows enhanced time resolution for adding timing related impairments, such as jitter, to the output waveform, giving greater control of impairing the output waveform for stress testing. Inputs to the waveform pattern generator 424 may include input waveform patterns from live-stream data received from receiver 300 or external to the communication link tester 100, the data output alignment control from the waveform triggering, alignment, and synchronization block 410, and clock and output waveform timing control from the clock generator/PLL 432.

The waveform pattern generator 424 may be followed by a digital up-converter and interpolation function 430. The digital up-converter and interpolation function 430 interpolates the waveform generated by the waveform pattern generator 424 to a higher output sample rate used by the DAC 440 downstream and can also optionally modulate the input waveform received from the waveform pattern generator 424 to shift the waveform from a lower to a higher output frequency range. When digital up-conversion is used, the waveform pattern generator can generate real or complex baseband waveform types that are then modulated to a higher frequency in the digital up-converter and interpolation function 430.

The clock generator/PLL 432 may use a Phase Locked Loop (PLL) or other oscillator to generate a base clock. The clock generator/PLL 432 may synthesize a digital representation of the clock waveform to emulate a traditional analog PLL. The clock generator/PLL 432 may also receive an external reference clock from another component of the communication link tester 100 (FIG. 1) or from outside the tester itself, such as through the local input 114. The clock generator/PLL 432 may be configured to support generation of stressed (including clock impairments emulated by the transmitter 400) or unstressed (without clock impairments emulated by the transmitter 400) clock outputs that can be synchronized to the baud rate/symbol period of the waveform pattern that is generated, which can be used for synchronization with other instruments. The clock outputs generated by the clock generator/PLL 432 can be at the output baud rate or divided down by a given ratio.

A jitter impairment generator 426 is coupled to the clock generator/PLL 432 to cause the clock generator to generate a waveform that varies in a controllable way from its original clock. Like the impairments produced by the amplitude noise impairment waveform generator 422, it may be useful to present the DUT 110 with a clockrate that is experiencing moderate or severe amounts of jitter and other timing related impairments for testing how well the DUT 110 reacts to such imperfect input.

Jitter insertion driven by the jitter impairment generator 426 is one aspect of stress testing used with communication standards. The types of jitter range from low to high frequency jitter coming in the form of periodic or aperiodic jitter. Also random jitter, bounded uncorrelated jitter and spread spectrum clocking are all examples of types of clock edge modulation the transmitter discussed herein can be configured to support.

Some serial or other high-speed data standards, like PCI-e, use spread spectrum clocking. A spread spectrum generator 428 is used to internally modulate the phase of a clock generator 432, which is described in detail below. The spread spectrum generator 428 shifts the phase of the clock by a controllable amount. One benefit of the clock shifting is a reduction in Electro Magnetic Interference (EMI), because it allows the spectral energy to be spread over more frequencies to reduce the magnitude of the EMI of the overall system.

Jitter and spread spectrum clocking from the jitter impairment generator 426 and the spread spectrum generator 428 can be inserted in embodiments of the invention through several potential methods. For instance, the jitter insertion from the jitter impairment generator 426 may be performed in conjunction with the resampling process described above. This can be done by using the jitter waveform to modulate the phase of each symbol transition in time. In another example, the jitter impairment generator may pass a signal through a continuously variable fractional delay filter. In this case the resampled signal is delayed by different amounts over time thus producing the effect of jitter. In other embodiments, jitter may be inserted by moving the phase of the DAC sample clock in the DAC 440 (FIG. 5) through use of an analog phase interpolator (PI) or other means. The analog PI can rotate through an entire DAC sample period range and rollover glitch free. The jitter waveform would be used to modulate the phase of the analog PI in the DAC 440. Further, the jitter impairment generator 426 may also insert low frequency jitter into the waveform by adding phase modulation to a reference clock used to generate the sample clock in the DAC 440.

The clock generator/PLL 432 precisely controls the edges of the clock, using clock impairments from the jitter impairment generator 426 and the spread spectrum generator 428 as controlling inputs.

After the waveform has been generated by the waveform pattern generator 424, using the clock generated by the clock generator/PLL 432, the transmitter 400 may modify the waveform further depending on various factors. For example a feed forward equalizer 434 may provide pre-emphasis equalization to the waveform based on channel conditions or operating conditions of the transmitter 400 or even the receiver 300. The feed forward equalizer 434 may accept a dynamic equalization control signal from the receiver 300 or from an external source. In some embodiments, no equalization need be performed by the feed forward equalizer 434.

Further impairments may be inserted into the waveform by an ISI impairment and channel emulation block 436, which may be used to generate Inter Symbol Interference (ISI) as well as modify the waveform to match particular selected communication channels. For example, if a particular reference channel experiences high-frequency roll off, it is possible that the ISI and channel emulation block 436 can emulate this by performing the same amount of roll off. In this way the transmitter 400 may emulate particular types of testing channels without requiring the waveform actually be sent over the impaired channel. Similarly, a channel non-linearity emulation block 438 may modify the waveform by the non-linear effects experienced in some particular types of components and channels. Including the emulation blocks 436 and 438 allows a user of the communication link tester to replace the necessity of using fixture boards to emulate particular channel impairments by allowing them to be precisely and controllably emulated using digital signal processing.

The functions of the particular blocks illustrated in FIG. 4 are performed in the digital domain, using DSP techniques. Further, the blocks illustrated in FIG. 4 may be wholly implemented in an FPGA, as described above. A memory and controller 444 is included in FIG. 4. Those having skill in the art will recognize that many parameters, controls, example waveforms, patterns, etc. may be stored in the memory and controller 444 for use by any of the components illustrated in FIG. 4. Additionally each of the individual block functions illustrated in FIG. 4 may include its own separate memory for its own purposes.

FIG. 5 illustrates an embodiment of the transmitter 150 (FIG. 1) in which all of the functions after the DAC 440 are performed in the analog domain. It should be noted that any of the functions within an analog transmitter portion 402, in different embodiments, may be implemented in the digital domain, in which case they would appear in the transmitter 400 of FIG. 4. Embodiments of the invention provide an extreme amount of flexibility in this regard.

A DAC 440 accepts the digital waveform generated by the digital portion of the transmitter 400 (FIG. 4) and converts it to an analog waveform signal. As described above, the DAC 440 may be oversampled compared to the output waveform. Oversampling provides the overhead for the clock jitter, spread spectrum control, and other features according to embodiments of the invention. The DAC 440 may have 8 bits or more of resolution.

The analog transmitter portion 402 of the transmitter 400 may then perform additional modifications to the analog waveform signal before being sent out of the transmitter 150 (FIG. 1). In some respects, the analog transmitter portion 402 illustrated in FIG. 5 may be an implementation of the output signal conditioner 160 of FIG. 1.

First, a variable gain/attenuation transmitter amplifier 450 sets the output gain for the waveform ultimately output from the transmitter portion of the communication link tester 100. By using the variable gain/attenuation transmitter amplifier 450, the user may increase or decrease the strength or amplitude of the output signal.

Next, a signal combiner 452 may combine in a selectable amount of impairments generated by the amplitude noise impairment waveform generator 422 of FIG. 4. In this way a selectable level of impairments generated by the amplitude noise impairment waveform generator 422 may be added to the output waveform. Although the amplitude noise impairment waveform generator 422 is illustrated and described in FIG. 4 as a digital generator, the noise and other impairments could also be generated using analog circuitry and would then be represented in the analog transmitter portion 402 of the transmitter 400. In the analog case, a controllable amplifier (not illustrated in FIG. 5) could be present as an input to the signal combiner 452 to controllably mix how much impairment was desired.

An impairment emulator 454 may add a controllable amount of differential skew and common mode impairment to the output waveform. Adding a differential skew allows the user to put additional delay on the output path, on either of the differential output signals. Such delay may be added by relay, forcing the output signal for a particular differential output through a longer or shorter trace-length path. A common mode impairment portion of the impairment emulator 454 generates noise for the common mode of a differential signal. For example, a common mode voltage could be varied by this portion of the impairment emulator to test how well a receiver reacts to differential signals that do not sum to be exactly 0 volts or how well the receiver rejects common mode noise from the input differential signal.

A crosstalk emulation block 456 may add synthesized crosstalk to the output waveform before being sent to the DUT 110 (FIG. 1). This block 456 emulates the effect of having adjacent or other channels being generated in addition to the output waveform. With reference to FIG. 2, recall that embodiments of the invention may operate with multiple channels, which is common in electrical equipment. The crosstalk emulation block 456 allows such crosstalk to be synthesized, or emulated, when only a single channel is actually being produced. In general, the crosstalk emulation block 456 blends a small portion of the final waveform from an adjacent channel into the main output waveform. The amount of amplitude from the adjacent channel can be controlled in the crosstalk emulation block 456. Sometimes the adjacent channels are called aggressor channels. The crosstalk emulation block 456 blends a certain amount of the aggressor channel into the final waveform. The end result is that the main output waveform from the transmitter 400 contains a small percentage of the aggressor channel crosstalk. This may be used in a testing manner to determine how much crosstalk a DUT coupled to the transmitter 400 could accept before an error occurs. Embodiments of the invention are not limited to a single aggressor channel for crosstalk. Instead, many channels may be blended, each at a controllable amount. Output of the crosstalk emulation block 456 is the main output waveform generated by the transmitter 400.

An output clock synthesizer 460 accepts the output from the clock generator/PLL 432 as an input to generate the final clock signal to be output by the transmitter 400. In some embodiments, the clock output from the transmitter 400 is a DSP synthesized clock. The output clock synthesizer 460 accepts a stream of counters, numbers and other data from the clock generator/PLL 432 and creates a physical clock output signal at the directed rate. The output clock synthesizer 460 may be formed by one or more DACs operating at the output rate of the output waveform. The DACs within the output clock synthesizer 460 need not have the same precision as the DAC 440, and instead may be a one or two bit DAC.

With reference to FIG. 1, by including a receiver 120 and a transmitter 150 in the same unit, and by including a high-speed parallel data bus 182 between the receiver and transmitter, the tight integration of components within the communication link tester 100 enables the link tester 100 to perform various operations in a much more efficient and precise manner than previous, disparate test assembly systems described above. The high-speed parallel data bus 182 provides excellent and high-speed communication between the receiver 120 and transmitter 150. The link user interface 140 and test applications 142 provide a complete, single, system for controlled operation of the communication link tester 100, rather than the ad-hoc software assembled to control prior systems. All of the components within the communication link tester 100 are controllable and are precisely specified so their capabilities exactly match the needs of the combined unit. Power use is minimized because the components of the communication link tester 100 share a common power supply 180. Additionally, a shared power supply means that all components of the communication link tester 100 are equally effected should the power supply deviate from the optimum output.

In other embodiments, the receiver 120 and transmitter 150 may be housed in separate physical units, but are tightly coupled and communicate through the high-speed parallel data bus 182 between the receiver and transmitter, or through other communication means, such as other electrical, optical, or wireless connections. Further, many receivers 120 and many transmitters 150 may be coupled to one another through a number of high-speed parallel busses 182 or the other communication means. This coupling may occur across multiple physical components. The number of receivers and number of transmitters need not be the same for every system. Although described above as a parallel bus 182, the communication path 182 may, in fact, be a serial bus, an optical connection, a wireless connection, or any other type of communication path.

Another benefit of an integrated communication link tester 100 is that it can perform functions not possible in prior test assemblies. Once such function relates to bit error testing, which takes advantage of the high speed receiver that can effectively capture an input signal and process it in real-time, with the high-speed transmitter that can purposefully generate stressed impairment and other conditions to trigger a bit error.

The receiver 120 in the communication link tester 100 can be configured to trigger on a given pattern or error criteria. For example, the receiver 120 may be configured to compare an input stream accepted from the DUT 110 to an output stream sent by the transmitter 150 to the DUT. If any bits received from the DUT 110 by the receiver 120 do not match those sent by the transmitter 150, a bit-error trigger is generated, which causes the receiver to immediately store data. After receiving the bit-error trigger, the receiver 150 can combine, aggregate, and store patterns and events across multiple input channels. In some embodiments, with reference to FIG. 3, after receiving the bit-error trigger, input data from the DUT 110 may be stored in any of the acquisition memories 314, 324, 374, and/or 344, or may be sent to the live stream data output 316. Example waveforms could be stored from output of the ADC 306, which is prior to the clock data recovery performed by the clock recovery processor 330. Alternatively, or additionally, the input data could be stored as waveform symbols after processing by the clock recovery processor 330, which may also be stored in any of the acquisition memories 314, 324, 374, and/or 344, or may be sent to the live stream data output 316. The eye diagram 336 may also be stored and linked to the input waveform. Additionally, the transmitter 150 may store the exact output waveform signal that caused the bit-error event to occur. Further, the transmitter can store the conditions applied to the output waveform signal when the bit error occurred. For example, if the bit-error occurred when over a threshold amount of crosstalk interference was applied by the crosstalk emulator 456 (FIG. 5), the settings that caused the crosstalk interference could be stored along with the input waveforms and data described above. Additionally, the communication link tester 100 may store the state of any or all of the adaptations of any or all of the component parts of either the receiver 120 and/or transmitter 150. For example, with reference to FIG. 3, the state of the clock recovery processor 330, equalizer 332, adaptation engine 340, DFE 334, protocol specific processor 370, any of the trigger pattern generators 352, 354, 356, and any of the triggers 364 may be stored, along with any of the state data associated with the transmitter 400 illustrated in FIG. 4, such as the data from the waveform triggering, alignment, and synchronization block 410, any of the impairment generators 422, 426, 428, the waveform pattern generator 424, the digital marker waveform generator 420, the clock generator/PLL 432, equalizer settings from the feed forward equalizer 434, as well as the emulation settings from emulators 436 and 438. In short, any setting or waveform data from anywhere in the communication link 100 tester may be captured for a time preceding the time the bit-error occurred and for a specified time thereafter, to aid the user in understanding how and why the bit error occurred. This captured data may be output to a user in real-time, stored in any of the acquisition memories 314, 324, 374, and/or 344, or may be sent to the live stream data output 316.

Further, all of the settings and waveforms may be time-aligned into a comprehensive graph or set of graphs or other visual outputs so that the user could visually identify those conditions that caused the bit error, and the results thereof. In other embodiments, test or debugging programs could be examples of the applications 142, 172 operating on the user link interface 140 or external computer 170, respectively. These test and debugging programs could automatically perform analysis on the data stored around the bit error event to attempt to determine the cause of the bit error. Such programs could include threshold values and other combinations of threshold levels for particular types of stored data. For example, the application 142, 172 may be programmed or learn to identify a particular sensitivity of the DUT to a particular type of clock jitter, or added impairment. Then, after a bit error, a user could run the analysis program 142, 172 to help identify the source of the particular error that occurred. In other embodiments, test or debugging programs or the data provided to or sent from the communication link tester 100 may be transmitted through the cloud input 118 and cloud output 116, thereby remotely accessing the communication link tester 100. Further, the cloud output 116 and cloud input 118 may be used to synchronize multiple coupled communication link testers 100, or may be used to send and receive data between one or more communication link testers.

In addition to bit error testing, the receiver 120 of FIG. 2 could be configured to trigger on particular data generated by the ADC 122. In such an embodiment, a pattern would be stored to which the output of the ADC 122 is compared. When the output from the ADC matches the triggering pattern, all of the waveform and other control data as described above may be stored for later analysis. In some embodiments, triggers can be set on specific situations and for a particular data protocol. This trigger could be set in or in conjunction with the protocol specific processing block 370. In operation, the data received from by the receiver 300 (FIG. 3) is analyzed as it is received. The protocol specific processing block 370 may be set to generate a trigger when particular data is received by the receiver and the input data matches a particular data protocol of interest. When both events occur simultaneously, i.e., when the protocol specific processing block 370 identifies that the data is received matching a particular protocol and when the input data received by the receiver 300 matches the desired pattern, the protocol specific processing block or other component within the receiver 300 may generate a trigger. In such an embodiment the receiver 120 effectively gates the link protocol state machine transitions and can use the transitions as triggering events. Generating the trigger then causes any or all of the input and/or output data described above with reference to bit-error to be stored for immediate or later analysis.

An integrated solution by combing the receiver 120 and transmitter 150 in the same device promotes ease in assembling a measurement setup and can make any need for debugging simpler and faster. Hence less time can be spent on functional tests and more on specialized tests, for example those dependent on and relevant to particular communication standards. Further examples of benefits associated with the architecture outlined above is the ability to modify firmware for custom use and a reduction in latency, which is not possible with a software based solution for a test assembly that combines different types of instruments.

The integrated solution can also enable ease in performing measurements to directly characterize a communications channel or loopback testing given both the transmitter and receiver are fully integrated.

The integrated solution also opens the door to other types of testing applications such as intentionally adding errors to an arbitrary data stream recovered in the receiver 120 and sending the resulting waveform to the transmitter 150. It will be appreciated that the above benefits are merely illustrative of the benefits this system can provide and that additional benefits will be readily recognized by a person of ordinary skill in the art utilizing the disclosed integrated solution or aspects thereof.

A further benefit of an integrated communication link tester 100 is that it can perform loopback testing with precision never before possible. Loopback testing is a method for testing the viability of a communication link. The integrated communication link tester 100 enables real-time tests with low latency, because the data may be received by the receiver 120 just as it is being placed on the channel by the transmitter 150. Further, the receiver 120, through the high-speed data connection 182, can know exactly what data is being sent by the transmitter 150.

Another variation of loopback testing can be supported in the integrated communication link tester 100, where the receiver captures an arbitrary waveform from the user and then uses the integrated transmitter to re-broadcast the waveform pattern, with data errors and/or other signal impairments, such as jitter, noise, etc. In such a loopback test, the receiver 120 is set to receive a waveform from the DUT 110, which itself may be a particular type of data channel. First the receiver 120 receives the arbitrary waveform from the data channel. Then the captured waveform is sent to the transmitter 150, which applies controlled impairments to the data, such as jitter, crosstalk, or any of the other impairments described with reference to the transmitter 400 of FIGS. 4 and 5. The transmitter applies the desired impairments to the waveform sent by the receiver 120, and then sends the impaired waveform back to the data channel.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), Field Programmable Gate Arrays (FPGAs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples

Illustrative examples of the technologies disclosed herein are provided below. An embodiment of the technologies may include any one or more, and any combination of, the examples described below.

Example 1 is a test and measurement device including an input configured to receive an analog signal from a Device Under Test (DUT); an Analog to Digital Converter (ADC) coupled to the input and structured to convert the analog signal to a digital signal; a receiver structured to accept the digital signal and perform signal conditioning, symbol recovery, and analysis on the digital signal using a first digital signal processor; a transmitter structured to use a second digital signal processor to generate a digital output signal; a Digital to Analog Converter (DAC) coupled to the transmitter and structured to convert the digital output signal from the transmitter to an analog signal, and structured to send the analog signal to the DUT; and a communication path between the receiver and the transmitter that does not pass through the DUT.

Example 2 is the test and measurement device of example 1, wherein at least portions of the first digital processor are physically embodied in a reconfigurable processor.

Example 3 is the test and measurement device of example 1, wherein at least portions of the first digital processor are physically embodied in a Field Programmable Gate Array.

Example 4 is the test and measurement device of any of examples 1-3, wherein at least portions of the second digital processor are physically embodied in a reconfigurable processor.

Example 5 is the test and measurement device of any of examples 1-4, wherein at least portions of the second digital processor are physically embodied in a Field Programmable Gate Array.

Example 6 is the test and measurement device of any of examples 1-5, wherein at least portions of the first digital processor or second digital processor are physically embodied in a Field Programmable Gate Array.

Example 7 is the test and measurement device of any of examples 1-6, wherein the transmitter and the receiver are housed in the same physical device.

Example 8 is the test and measurement device of any of examples 1-7, wherein the transmitter and the receiver are housed in separate physical devices, and in which the communication path between the receiver and the transmitter is a wired connection.

Example 9 is the test and measurement device of any of examples 1-8, wherein the transmitter and the receiver are housed in separate physical devices, and in which the communication path between the receiver and the transmitter is a wireless connection.

Example 10 is the test and measurement device of any of examples 1-9, wherein the DUT is a communication channel.

Example 11 is a test and measurement device including an input configured to receive an analog signal from a Device Under Test (DUT); an Analog to Digital Converter (ADC) coupled to the input and structured to convert the analog signal to a digital signal; a receiver structured to accept the digital signal and, using a first digital signal processor, perform signal conditioning, symbol recovery, and analysis on the digital signal at a rate that is the same or exceeds a rate at which the analog signal is received from the DUT to continuously process the analog signal from the DUT.

Example 12 is the test and measurement device of example 11, in which the analog signal is converted to a digital signal at a rate of over 500 MSamples/second.

Example 13 is the test and measurement device of example 11-12, wherein the receiver includes an eye diagram generator structured to continuously generate an eye diagram for the digital signal without halting receiving the analog signal from the DUT.

Example 14 is the test and measurement device of example 11-13, wherein the receiver includes a second input to receive a second analog signal from a second Device Under Test (DUT).

Example 15 is the test and measurement device of example 11-14, wherein the analog signal and the second analog signal are synchronized to one another.

Example 16 is the test and measurement device of example 11-15, wherein the analog signal and the second analog signal respectively carry a first and a second portion of a signal according to a specific protocol.

Example 17 is the test and measurement device of example 11-16, wherein the receiver is structured to recover protocol signals according to the specific protocol from the combination of the analog signal and the second analog signal.

Example 18 is a transmitter portion of a test and measurement device, including a signal generator structured to generate a base output signal; a digital signal processor structured to add one or more impairments to the base output signal to form a combined output signal; and a Digital to Analog Converter (DAC) coupled to the digital signal processor and structured to convert the combined output signal to an analog signal, and to send the analog signal to a device for testing.

Example 19 is a transmitter portion of a test and measurement device of example 18, further comprising a second signal generator to generate a second output signal.

Example 20 is a transmitter portion of a test and measurement device of examples 18-19, wherein the base output signal and the second output signal each carry a portion of a protocol signal.

Example 21 is a transmitter portion of a test and measurement device of examples 18-20, further comprising a differential skew generator and in which the generated differential skew is added to the analog signal prior to being output to the device for testing.

Example 22 is a transmitter portion of a test and measurement device of examples 18-21, further comprising a common mode impairment emulator and in which the generated common mode impairment is added to the analog signal prior to being output to the device for testing.

Example 23 is a transmitter portion of a test and measurement device according to examples 18-22, in which one of the one or more impairments comprises inter-symbol interference generated by an inter-symbol interference emulator.

Example 24 is a transmitter portion of a test and measurement device according to examples 18-23, in which another impairment comprises cross-talk emulation generated by a cross-talk emulator.

Example 25 is a transmitter portion of a test and measurement device according to examples 18-24, further comprising a clock generator, and in which the transmitter portion of the test and measurement device is structured to send a clock signal that is generated by the clock generator to the device.

Example 26 is a transmitter portion of a test and measurement device according to examples 18-25, further comprising a clock stress generator structured to modify the clock signal before being sent to the device.

Example 27 is a transmitter portion of a test and measurement device according to examples 18-26, in which the clock stress generator is a jitter impairment generator.

Example 28 is a transmitter portion of a test and measurement device according to examples 18-27, in which the clock stress generator is structured to generate clock skew.

Example 29 is a transmitter portion of a test and measurement device according to examples 18-28, further comprising a digital marker waveform generator, and in which the transmitter portion of the test and measurement device is structured to send a digital marker signal that is generated by the digital marker waveform generator to the device.

Example 30 is a transmitter portion of a test and measurement device according to examples 18-29, in which the digital marker signal is related to the analog signal.

Example 31 is a transmitter portion of a test and measurement device according to examples 18-30, in which the digital marker signal is synchronized to the analog signal.

Example 32 is a transmitter portion of a test and measurement device according to examples 18-31, further comprising a noise impairment waveform generator and in which the generated noise impairment is added to the analog signal prior to being output to the device for testing.

Example 33 is test and measurement device including a signal receiver structured to receive one or more input signals and to generate an input data stream therefrom; a bit error trigger generator configured to generate a bit error based on a comparison of a static trigger pattern to a portion of the input data stream; a memory store configured to, after the bit error trigger is generated, store at least one of the one or more input signals and related data and measurements in a memory including a portion of the stored signal as it existed before the bit error trigger was generated.

Example 34 is a test and measurement device according to example 33, in which the static trigger pattern is specified by a user of the test and measurement device.

Example 35 is a test and measurement device according to examples 33-34, in which the static trigger pattern is an analog signal.

Example 36 is a test and measurement device according to examples 33-35, in which the signal receiver is structured to perform a first test prior to the bit error being triggered and in which the signal receiver is structured to perform a second test after the bit error is triggered.

Example 37 is a test and measurement device according to examples 33-36, in which the one or more input signals are received from a device or communication link, and the test and measurement device further comprising an impairment generator and a transmitter coupled to the device or communication link.

Example 38 is a test and measurement device according to examples 33-37, in which the the impairment generator is structured to generate a first set of impairments prior to the bit error being triggered and in which the impairment generator is structured to generate a first set of impairments after the bit error is triggered.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement device, comprising:
   an input configured to receive an analog signal from a Device Under Test (DUT);
   an Analog to Digital Converter (ADC) coupled to the input and structured to convert the analog signal to a digital signal;
   a receiver structured to accept the digital signal and perform signal conditioning, symbol recovery, and analysis on the digital signal at a rate that is the same or exceeds a baud rate of the analog signal.

2. The test and measurement device according to claim 1, in which the receiver includes an eye diagram generator structured to continuously generate an eye diagram for the digital signal without halting receiving the analog signal from the DUT.

3. The test and measurement device according to claim 1, in which the receiver includes a second input to receive a second analog signal from a second Device Under Test (DUT), in which the analog signal and the second analog signal respectively carry a first and a second portion of a signal according to a specific protocol, and in which the receiver is structured to recover protocol signals according to the specific protocol from a combination of the analog signal and the second analog signal.

4. A test and measurement device, comprising:
a signal generator structured to generate a base output signal;
a digital signal processor structured to add one or more impairments to the base output signal to form a combined output signal;
a Digital to Analog Converter (DAC) coupled to the digital signal processor and structured to convert the combined output signal to an analog signal, and to output the analog signal to a device for testing; and
an analog impairment emulator coupled to the DAC and structured to modify the analog signal prior to being output to the device for testing.

5. The test and measurement device according to claim 4, further comprising a second signal generator to generate a second output signal, in which the base output signal and the second output signal each carry a portion of a protocol signal.

6. The test and measurement device according to claim 4, in which the analog impairment emulator comprises a differential skew generator and in which a generated differential skew is added to the analog signal prior to being output to the device for testing.

7. The test and measurement device according to claim 4, in which the analog impairment emulator comprises a common mode impairment emulator and in which a generated common mode impairment is added to the analog signal prior to being output to the device for testing.

8. The test and measurement device according to claim 4, in which one of the one or more impairments comprises inter-symbol interference generated by an inter-symbol interference emulator.

9. The test and measurement device according to claim 4, further comprising a clock generator, and in which test and measurement device is structured to send a clock signal that is generated by the clock generator to the device for testing.

10. The test and measurement device according to claim 9, further comprising a clock stress generator structured to modify the clock signal before being sent to the device for testing.

11. The test and measurement device according to claim 4, further comprising a digital marker waveform generator, and in which the test and measurement device is structured to send a digital marker signal that is generated by the digital marker waveform generator to the device for testing.

12. The test and measurement device according to claim 11, in which the digital marker signal is related to the analog signal.

13. The test and measurement device according to claim 12, in which the digital marker signal is synchronized to the analog signal.

14. The test and measurement device according to claim 4, further comprising a noise impairment waveform generator and in which a generated noise impairment is added to the analog signal prior to being output to the device for testing.

15. A test and measurement device, comprising:
an input configured to receive an analog signal from a Device Under Test (DUT);
an Analog to Digital Converter (ADC) coupled to the input and structured to convert the analog signal to a digital signal;
a receiver structured to accept the digital signal and perform signal conditioning, symbol recovery, and analysis on the digital signal;
a transmitter structured to generate a digital output signal;
a Digital to Analog Converter (DAC) coupled to the transmitter and structured to convert the digital output signal from the transmitter to an analog signal, and structured to send the analog signal to the DUT; and
a communication path between the receiver and the transmitter that does not pass through the DUT, wherein the communication path is configured to communicate the digital output signal to the receiver, wherein the receiver is configured to compare the digital signal to the digital output signal, and to cause a bit-error trigger when a bit of the digital signal does not match a corresponding bit of the digital output signal.

16. The test and measurement device according to claim 15, in which the transmitter and the receiver are housed in the same physical device.

17. The test and measurement device according to claim 15, in which the transmitter and the receiver are housed in separate physical devices, and in which the communication path between the receiver and the transmitter is a wireless connection.

18. The test and measurement device according to claim 15, wherein the receiver is structured to capture and process the digital signal in real-time.

19. The test and measurement device according to claim 15, wherein the analog signal includes an impairment so that a bit of the digital signal captured by the receiver does not match a corresponding bit of the digital output signal.

* * * * *